US010593707B2

(12) United States Patent
Li (10) Patent No.: US 10,593,707 B2
(45) Date of Patent: Mar. 17, 2020

(54) ARRAY SUBSTRATE AND DISPLAY PANEL USING THE SAME

(71) Applicants: HKC Corporation Limited, Shenzhen, Guangdong (CN); Chongqing HKC Optoelectronics Technology Co., Ltd., Chongqing (CN)

(72) Inventor: Zeyao Li, Chongqing (CN)

(73) Assignees: HKC Corporation Limited, Shenzhen, Guangdong (CN); Chongqing HKC Optoelectronics Technology Co., Ltd., Chongqing (CN)

( * ) Notice: Subject to any disclaimer, the term of this patent is extended or adjusted under 35 U.S.C. 154(b) by 0 days.

(21) Appl. No.: 15/745,548

(22) PCT Filed: Dec. 19, 2017

(86) PCT No.: PCT/CN2017/117080
§ 371 (c)(1),
(2) Date: Jan. 17, 2018

(87) PCT Pub. No.: WO2019/071815
PCT Pub. Date: Apr. 18, 2019

(65) Prior Publication Data
US 2019/0115368 A1 Apr. 18, 2019

(30) Foreign Application Priority Data
Oct. 12, 2017 (CN) .......................... 2017 1 0946995

(51) Int. Cl.
*H01L 27/12* (2006.01)
*G02F 1/1362* (2006.01)
(Continued)

(52) U.S. Cl.
CPC ...... *H01L 27/124* (2013.01); *G02F 1/136286* (2013.01); *G09G 3/3614* (2013.01);
(Continued)

(58) Field of Classification Search
CPC ....... H01L 27/15; H01L 33/38; H01L 27/156; G06F 3/041; G06F 3/044; G06F 3/0412;
(Continued)

(56) References Cited

U.S. PATENT DOCUMENTS

2007/0064190 A1 3/2007 Kim
2010/0245333 A1 9/2010 Hsu et al.
(Continued)

FOREIGN PATENT DOCUMENTS

CN 104267555 A 1/2015
CN 105206211 A 12/2015
(Continued)

OTHER PUBLICATIONS

International Search Report and Written Opinion (with English Translation) dated Jul. 17, 2018, in International Application No. PCT/CN2017/117080.

*Primary Examiner* — Alexander O Williams
(74) *Attorney, Agent, or Firm* — Muncy, Geissler, Olds & Lowe, P.C.

(57) ABSTRACT

A array substrate comprises: a substrate including a display area and a peripheral wiring area, wherein active switches, pixel units and signal lines are disposed in the display area, the pixel units are coupled to the active switches, the active switches are coupled to the signal lines, and the signal lines include gate lines and source lines, each pixel unit includes a first subpixel and a second subpixel are coupled to different gate lines, and coupled to a common source line, input interface of the gate lines is disposed in the wiring area; a gate driving module disposed in the wiring area and including output interfaces; connecting lines disposed between the input interfaces and the output interfaces, wherein the connecting lines include wiring line groups and jumper line
(Continued)

groups, a sequence of signals of jumper line groups is different from a sequence of signals of wiring line groups.

18 Claims, 7 Drawing Sheets

(51) Int. Cl.
*G09G 3/36* (2006.01)
*G02F 1/1368* (2006.01)

(52) U.S. Cl.
CPC .......... *G09G 3/3648* (2013.01); *G09G 3/3677* (2013.01); *G09G 3/3688* (2013.01); *G02F 1/1368* (2013.01); *G09G 2300/0426* (2013.01)

(58) Field of Classification Search
CPC ... G09G 5/00; G09G 5/006; G09G 2300/0426
USPC .......................................................... 257/72
See application file for complete search history.

(56) References Cited

U.S. PATENT DOCUMENTS

| | | | |
|---|---|---|---|
| 2015/0220206 A1* | 8/2015 | Knausz | G06F 3/0418 345/174 |
| 2015/0309613 A1* | 10/2015 | Morein | G06F 3/044 345/174 |
| 2016/0026313 A1* | 1/2016 | Morein | G06F 3/0412 345/174 |
| 2017/0003791 A1* | 1/2017 | Berget | G06F 3/044 |

FOREIGN PATENT DOCUMENTS

| | | |
|---|---|---|
| CN | 105319786 A | 2/2016 |
| CN | 105575322 A | 5/2016 |

* cited by examiner

ARRAY SUBSTRATE AND DISPLAY PANEL USING THE SAME

BACKGROUND OF THE INVENTION

Field of Invention

The present invention generally relates to a wiring technology field, and especially to an array substrate and a display panel using the same.

Description of Related Art

A liquid crystal display apparatus uses both electrical properties and optical properties of liquid crystals to display image. Liquid crystals have anisotropy property. For example, there is a difference of refractive index and dielectric constant between the principal and secondary axes of the liquid crystal molecule. The molecular arrangement and the optical properties of the liquid crystals can be easily adjusted. Therefore, the liquid crystal display apparatus can change the arrangement direction of the liquid crystal molecules according to the intensity level of the electric field to adjust the transmittance of the light transmitted through the polarizing plate, so that the liquid crystal display apparatus can display an image.

A liquid crystal display apparatus comprises a liquid crystal display panel and a driving circuit. The liquid crystal display panel includes a plurality of pixels arranged in a matrix form. The driving circuit includes a gate driver for driving a gate line of the liquid crystal display panel, and a data driver for driving a data line of the liquid crystal display panel. In order to reduce the cost of the liquid crystal display device, it has been considered to reduce the number of output channels of the data driver by reducing the number of data lines while maintaining the resolution of the liquid crystal panel.

In a half source driving (HSD) pixel array, a left subpixel and a right subpixel are adjacent to each other and can share a common data line, so that the number of data line is halved with respect to the number of data lines of the conventional liquid crystal driving pixel array. Therefore, a cost is accordingly reduced. However, as the gate signal is turned on in half the conventional time, the charging time of the data line to the pixel is only half of the conventional liquid crystal driving pixel array, which easily results in a problem of insufficient pixel power charging.

In order to reduce the power consumption of the display, many products use a AC driving method, for example, a line-and-two-dot-inversion driving method. The line-and-two-dot-inversion driving method is a driving method combining a line inversion method and a dot inversion method. It is performed that a signal is transmitted and constantly switched between positive and negative polarities in each two subpixels (two dots) as a switch unit in a line, and subpixels of two adjacent lines are switched between positive and negative polarities in each line as a switch unit. From the driving waveform, a data driving IC switches or reverses a driving signal voltage in two addressing time (2 Hsync cycles) as a switch unit, so that a waveform frequency is between the dot inversion mode and the line inversion mode. Therefore, the power consumption of the line two dot inversion driving mode is much lower than a conventional dot reversal inversion mode.

However, when the line two dot inversion driving mode is applied to the half source driving (HSD) pixel array, it will have a big problem. Since the polarities of two adjacent pixels (two dots) in a line are the same, there is a large difference in the latency of a signal arriving at adjacent pixels. There will be differences between the brightness between adjacent pixels, resulting in a problem of adjacent vertical bright and dark lines in the image. Therefore, the display quality is declined. Especially in low gray scale display, this phenomenon is more serious.

SUMMARY OF THE INVENTION

For resolving the technical problems above-mentioned, the objects of the present invention are to provide an array substrate and a display panel using the same. The present invention can smooth a brightness uneven phenomenon and resolve the problem of a problem of adjacent vertical bright and dark lines in an image through wiring design and adjusting a receiving sequence of a line signal in a display area.

The objects and technical solutions of the present invention can be further implemented by following technical configuration and means. In one perspective, the present array substrate comprises: a substrate including a display area and a peripheral wiring area of the display area, wherein a plurality of active switches, a plurality of pixel units and a plurality of signal lines, are disposed in the display area, the plurality of pixel units are electrically coupled to the plurality of active switches respectively, the plurality of active switches are electrically coupled to the plurality of signal lines respectively, and the plurality of signal lines include a plurality of gate lines and a plurality of source lines, wherein each pixel unit includes a first subpixel and a second subpixel, the first subpixel and the second subpixel are electrically coupled to different gate lines respectively through corresponding active switches, the first subpixel and the second subpixel are electrically coupled to a common source line, and a plurality of input interface of the plurality of gate lines are disposed in the wiring area; a gate driving module disposed in the wiring area, the gate driving module including a plurality of output interfaces; and a plurality of connecting lines disposed between the plurality of input interfaces and the plurality of output interfaces, so that the plurality of input interfaces are electrically coupled to the plurality of output interfaces respectively; wherein the plurality of connecting lines include a plurality of wiring line groups and a plurality of jumper line groups, the plurality of wiring line groups and the plurality of jumper line groups are disposed by interlacing each other, and a sequence of signals outputted from the plurality of jumper line groups are different from a sequence of signals outputted from the plurality of wiring line groups.

The objects and technical solutions of the present invention can be further implemented by following technical configuration and means.

In one embodiment of the present invention, each jumper line group includes a first wiring line and a second wiring line, wherein the second wiring line includes a turning line, a straight line, a curve line, or a slanted line.

In one embodiment of the present invention, the plurality of jumper line groups include a two-wiring line combination, a three-wiring line combination, a four-wiring line combination, or a combination thereof.

In one embodiment of the present invention, control signals are outputted from the gate driving module through the plurality of output interfaces in a first sequence, and the control signals are received by the plurality of input interfaces in a second sequence, wherein the control signals are got by the plurality of connecting lines through the plurality of output interfaces in the first sequence, and the control signals are outputted to the plurality of input interfaces in the second sequence.

In one embodiment of the present invention, the first sequence is the same as (corresponds to) the line layout sequence of the plurality of output interfaces.

In one embodiment of the present invention, the gate driving module includes a gate-chip on film covering the peripheral of the substrate, wherein the gate-chip on film includes a plurality of output interfaces.

In one embodiment of the present invention, the plurality of connecting lines are disposed in a fan-out area of the wiring area.

In one embodiment of the present invention, the plurality of wiring line groups and the plurality of jumper line groups are disposed differently and interlaced in each two adjacent line groups. Or, the plurality of wiring line groups and the plurality of jumper line groups can be disposed by interlacing each other in a continuous way or a partially continuous way.

In another perspective, the present array substrate comprises: a substrate including a display area and a peripheral wiring area of the display area, wherein a plurality of active switches, a plurality of pixel units and a plurality of signal lines are disposed in the display area, the plurality of pixel units are electrically coupled to the plurality of active switches respectively, the plurality of active switches are electrically coupled to the plurality of signal lines respectively, and the plurality of signal lines include a plurality of gate lines and a plurality of source lines, wherein each pixel unit includes a first subpixel and a second subpixel, the first subpixel and the second subpixel are electrically coupled to different gate lines respectively through corresponding active switches, the first subpixel and the second subpixel are electrically coupled to a common source line, a plurality of input interfaces of the plurality of gate lines are disposed in the wiring area, and the plurality of input interfaces include a first input interface and a second input interface; a gate driving module disposed in the wiring area, the gate driving module including a plurality of output interfaces, control signals outputted from the gate driving module according to the line layout sequence of the plurality of output interfaces, and the plurality of output interfaces include a first output interface and a second output interface; and a plurality of connecting lines disposed between the plurality of input interfaces and the plurality of output interfaces, so that the plurality of input interfaces are electrically coupled to the plurality of output interfaces respectively; wherein the plurality of connecting lines include a plurality of wiring line groups and a plurality of jumper line groups, the plurality of wiring line groups and the plurality of jumper line groups are disposed by interlacing each other, the plurality of jumper line groups include a two-wiring line combination, the two-wiring line combination includes a first wiring line and a second wiring line, the first wiring line electrically couple between the first output interface and the second input interface, the second wiring line electrically couple between the second output interface and the first input interface, the second wiring line is disposed in a turning, line, a straight line, a curve line, or a slanted line, the first wiring line is disposed in a jumper line, a sequence of input signals is contrary to a sequence of output signals for the two-wiring line combination, and a sequence of the control signals outputted from the plurality of output interfaces is different from a sequence of the control signals received by the plurality of input interfaces.

In another perspective, the present display panel comprises: a corresponding substrate; and an array substrate disposed oppositely to the corresponding substrate, wherein the array substrate can include any array substrate of above-mentioned embodiments.

The advantages of the present invention include that it does not need to change any conventional manufacturing process, and can fulfil prior manufacturing requirements and maintain prior product cost. Only through wiring layout, the present invention can change a receiving sequence of the control signal in a display area. The present can achieve the purpose of adjusting the polarity of the pixel unit by adjusting the receiving sequence of the signal, so that the problem of adjacent vertical bright and dark lines in an image is resolved. In addition, since the present invention can change the receiving sequence of the control signal in the display area only through wiring layout, the sequence of output signals of driving components (for example, a driving IC, a driving chip) do not need to be changed or adjusted, so that the cost of components can be reasonably reduced. Furthermore, since the present invention can change the receiving sequence of the control signal in the display area only through wiring layout, it can be applied to many types of display panel, so that the applicability is relatively high.

DESCRIPTION OF THE PREFERRED EMBODIMENTS

The drawings as referred to following embodiments throughout the description of the present invention are examples for implementing the objects of the present invention. The orientation words or terms used in the description of the present invention, such as "above", "under", "forward", "backward", "left", "right", "inner", "outer", and "side". are examples in the drawings for illustrative purpose only, or just show the interrelations between the components, but not to be construed as limitations to the scope of the present invention.

The drawings and the description of the present invention are deemed to be examples but not limitations essentially. In the drawings, components or elements having similar or same structure are marked with the same numbers. In addition, sizes and thicknesses of every component or element are just examples, but not drawn according to the actual scale and not read as limitations to the scope of the present invention.

In drawings of the present invention, sizes and thicknesses of layers, films, panels, or regions are emphasized for clearness, easy to describe and easy to understand. Therefore, some layers, films, or regions are emphasized but, not drawn according to their actual scales. It is to be understood that, for example, when one of the components of layers, films, regions, or substrate are "on" another component of layers, films, regions, or substrate, the one of the components of layers, films, regions, or substrate could be adjacent on another component of layers, films, regions, or substrate directly, or there could be other inter-components of layers, films, regions, or substrate disposed therebetween.

Furthermore, in the description of the present invention, a word "comprising" or "including" is construed to comprise or include the related components, but not exclude other components, except there is clearly opposite word or description in the present invention. And, in the description of the present invention, a word "on" can be construed to be above or under a target component, but not only construed to be on a top of the target component in vertical or gravity direction.

For further clarifying the technical solutions or functions of the present invention to implement the objects of the present invention, an array substrate and a display panel using the same, and their specific implementations, structures, features and functions, according to a preferred embodiment of the present invention will be apparent from the following detailed description, which proceeds with reference to the accompanying drawings.

Figure 1A:
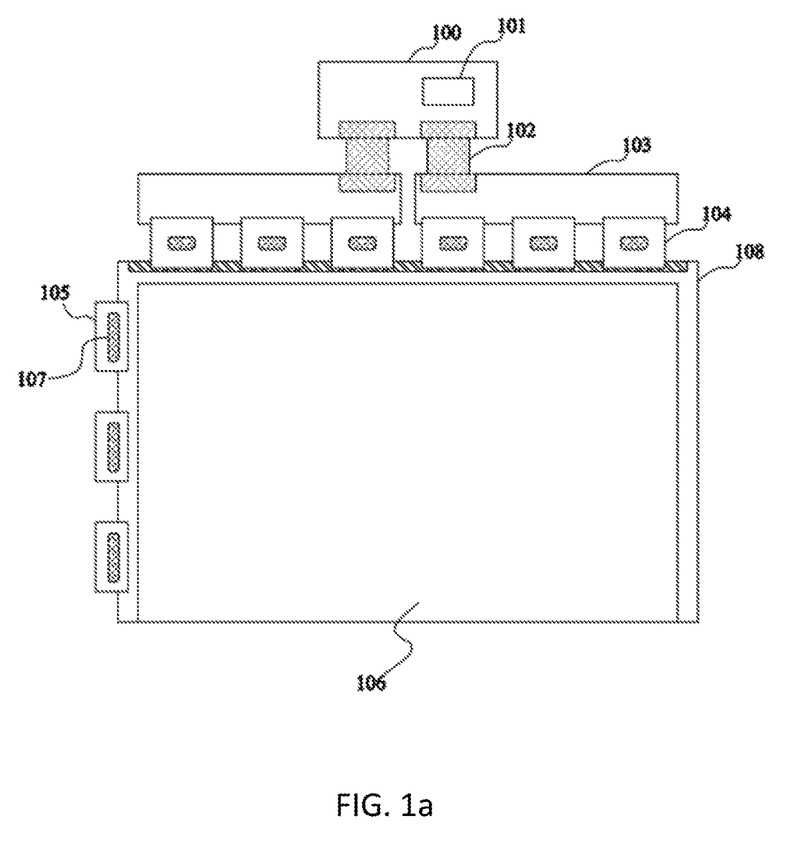
FIG. 1a shows a top view illustrating an exemplary structure of a display apparatus.

FIG. 1a shows a top view illustrating an exemplary structure of a display apparatus. Please refer to FIG. 1a, a liquid crystals display apparatus comprises: a control board 100, the control board 100 including a timing controller (TCON) 101; a printed circuit board 103 electrically connected to the control board 100 through a flexible flat cable (FFC) 102; a source-chip on film (S-COF) 104 and a gate-chip on film (G-COF) 105 electrically connected to a data line and a scan line in a display area 106 respectively; and its peripheral wiring area 108.

In some embodiments of the present invention, a driving method for a display apparatus comprises: providing a color (for example, red, green or blue) compression signal, a control signal and a power to the control board 100 by a system main board. After these foregoing signals processed by the timing controller 101 of the control board 100, the power is processed by a driving circuit, then the power and these signals above-mentioned are transmitted to a source circuit and a gate circuit of the printed circuit board 103 through a flexible flat cable (FFC) 102. Necessary data and the power are transmitted to the display area 106 through a source-chip on film (S-COF) 104 and a gate-chip on film (G-COF) 105, so that the display area 106 can get the necessary data and the power for displaying an image.

Figure 1B:
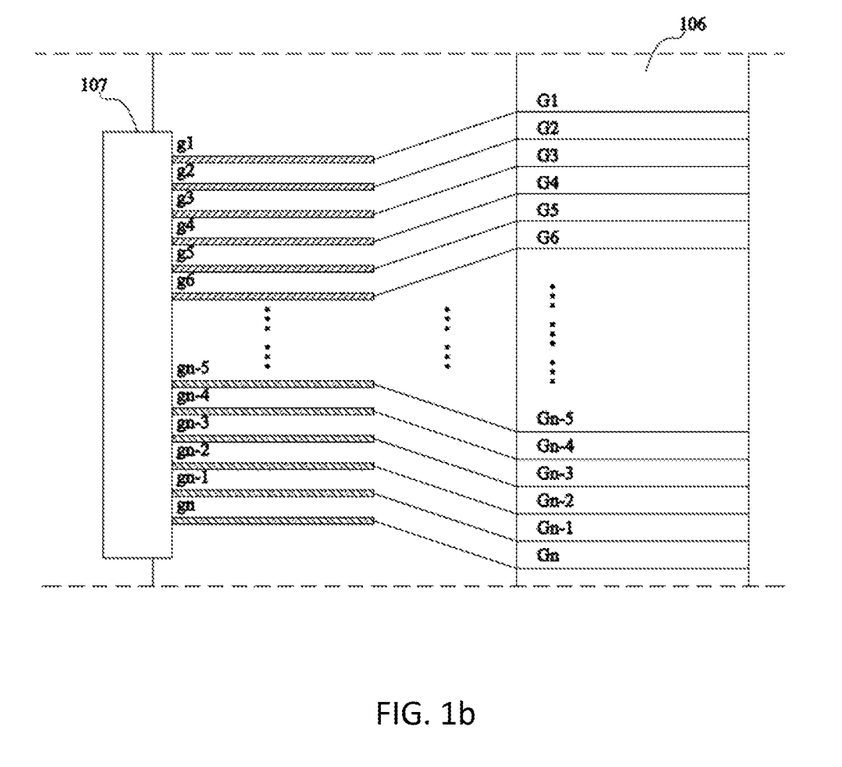
FIG. 1b shows an exemplary wiring structure of a fan-out area of a display apparatus.

FIG. 1b shows an exemplary wiring structure of a fan-out area of a display apparatus. For better understanding, please refer to FIG. 1b together with FIG. 1a. As shown, in FIG. 1b, corresponding integrated circuits (IC) are disposed on a chip on film (COF). In some embodiments of the present invention, channels of the integrated circuits (IC) are substantially connected to conductive lines of the display area 106 in sequence respectively. According to different integrated circuits, different conductive lines are used for connecting to different channels of the integrated circuits. For example, gate integrated circuits are used for connecting to scan lines (gate lines), or, source integrated circuits are used for connecting to data lines (source lines).

As shown in FIG. 1b, taking a gate integrated circuit 107 as an example, the sequence of channels of the integrated circuit 107 is from g1 to gn. Accordingly, the sequence of output signals of the gate integrated circuit 107 is also adjusted to the same as (or adjusted to be corresponding to) the sequence of channels of the integrated circuit 107.

Figure 1C:
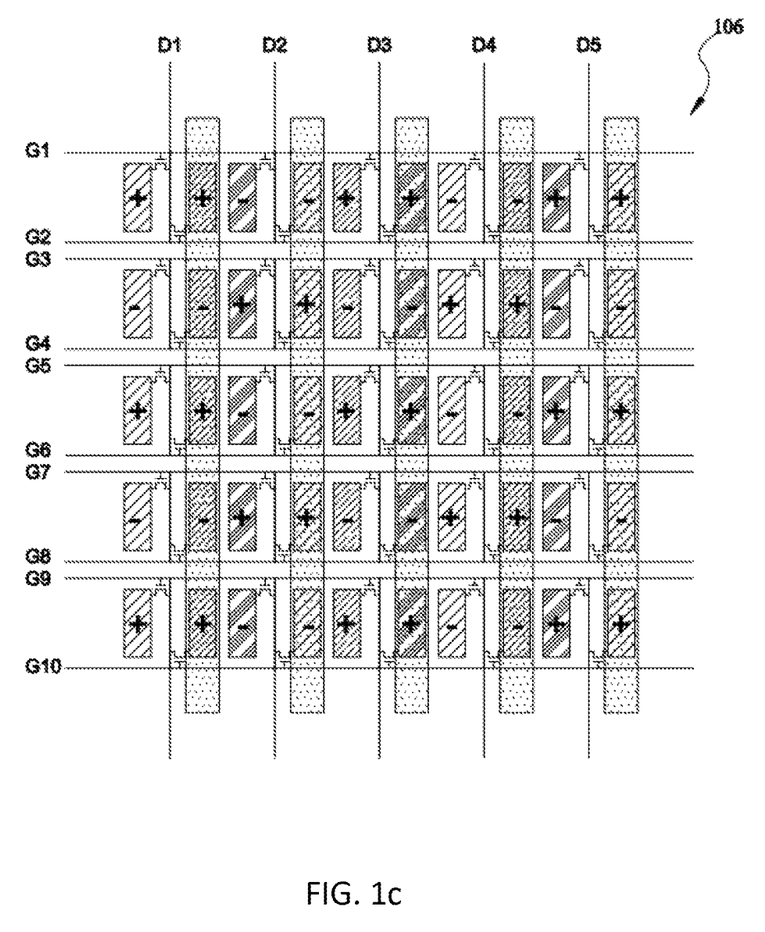
FIG. 1c shows exemplary polarities of a pixel unit of a display apparatus.

FIG. 1c shows exemplary polarities of a pixel unit of a half source driving (HSD) display panel. For better understanding, please refer to FIG. 1c together with FIGS. 1a and 1b. As shown in FIG. 1c, a display area 106 comprises a plurality of active switches and a plurality of pixel units, wherein the pixel units electrically couple the active switches, and the active switches electrically couple scan lines and data lines. Each pixel unit includes a first subpixel and a second subpixel which have different colors, wherein the first subpixel and the second subpixel are electrically connected to different scan lines through the corresponding active switches, while the first subpixel and the second subpixel electrically are connected to a common data line. For example, a pixel unit on a scan line D1 comprises a first subpixel and a second subpixel, wherein the first subpixel and the second subpixel electrically are connected to a scan line G1 and a scan line G2 through the active switch respectively, while the first subpixel and the second subpixel electrically are connected to a common data line D1. Comparing to a conventional display panel, the present pixel array layout needs half the number of conventional data lines. However, as the gate signal of the scan line is turned on in half the conventional time, so that the charging time of the data line to the pixel is only half of the conventional liquid crystal driving pixel array.

In some embodiments of the present invention, the present invention uses a line-and-two-dot-inversion driving method. The line-and-two-dot-inversion driving method is a driving method combining a line inversion method and a dot inversion method. It is performed that a signal is transmitted and constantly switched between positive and negative polarities in each two subpixels (two dots) as a switch unit in a line, and adjacent two lines of subpixels are switched between positive and negative polarities in each line as a switch unit. As shown in FIG. 1c, when the line-and-two-dot-inversion driving method is applied to a half source driving (HSD) pixel array, as the gate signal of the scan line is turned on in half the conventional time, the charging time of the data line to the pixel is only half of the conventional liquid crystal driving pixel array, which easily results in a problem of insufficient pixel power charging. In addition, since the polarities of two adjacent pixels (two dots) in a line are the same, there is a large latency difference of a signal arriving at adjacent pixels. Therefore, a subpixel located in the subsequent position will be undercharged. There will accordingly be differences between the brightness between adjacent pixels, resulting in a problem of adjacent vertical bright and dark lines in a display image.

Figure 2A:
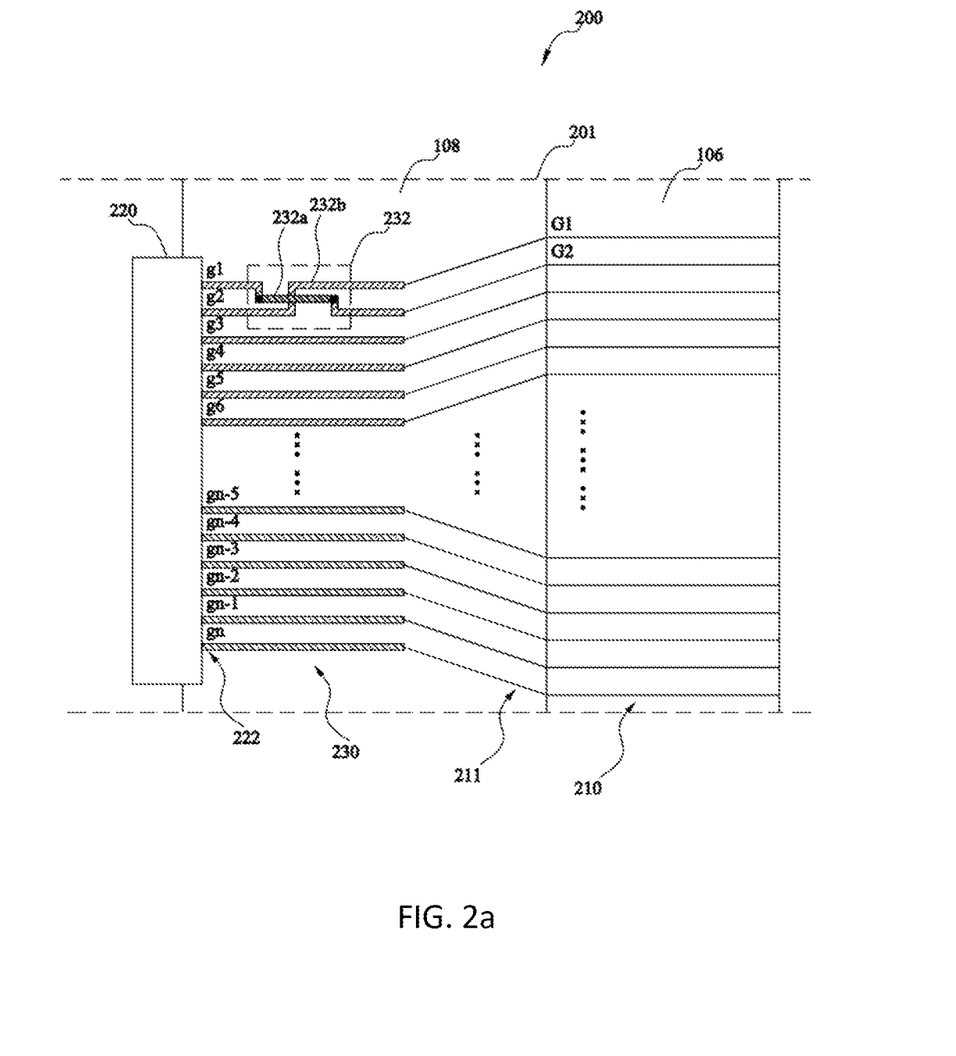
FIG. 2a shows a wiring structure of a display panel according to an embodiment of the present invention.

FIG. 2a shows a wiring structure of a display panel according to an embodiment method of the present invention. Please refer to FIG. 2a together with FIGS. 1a to 1c for better understanding of component disposed of the present display panel. As shown in FIG. 2a, in one embodiment of the present invention, an array substrate 200 comprises: a substrate 201, a gate driving module 220 and a plurality of connecting lines 230. The substrate 201 includes a display area 106 and its peripheral wiring area 108, wherein a plurality of active switches, a plurality of pixel units and a plurality of signal lines are disposed on the display area 106, the plurality of pixel units are electrically coupled to the plurality of active switches respectively, the plurality of active switches are electrically coupled to the plurality of signal lines respectively, and the plurality of signal lines include a plurality of gate lines 210 and a plurality of source lines. Each pixel unit is composed of a first subpixel and a second subpixel, wherein the first subpixel and the second subpixel are electrically coupled to different gate lines 210 respectively through corresponding active switches, and the first subpixel and the second subpixel are electrically coupled to a common source line. A plurality of input interfaces 211 of the plurality of gate lines 210 are disposed in the wiring area 108. The gate driving module 220 is disposed in the wiring area 108. The gate driving module 220 includes a plurality of output interfaces 222. The plurality of connecting lines 230 are disposed between the plurality of input interface 211 and the plurality of output interfaces 222, so that the plurality of input interfaces 211 are electrically coupled to the plurality of output interfaces 222 respectively. The plurality of connecting lines 230 include a plurality of wiring line groups 231 and a plurality of jumper line groups 232, and the plurality of wiring line groups 231 and the plurality of jumper line groups 232 are disposed by interlacing each other. The sequence of output signals of the plurality of jumper line group 232 is different from the sequence of output signals of the plurality of wiring line group 231.

In some embodiments of the present invention, each of the plurality of jumper line groups 232 includes a first wiring line and a second wiring line, wherein the second wiring line includes a turning line, a straight line, a curve line, or a slanted line.

In some embodiments of the present invention, control signals are outputted from the gate driving module 220 through the plurality of output interfaces 222 in a first sequence, and the control signals are received by the plurality of input interfaces 211 in a second sequence, wherein the control signals are got by the plurality of connecting lines 230 through the plurality of output interfaces 222 in the first sequence, and the control signals are outputted to the plurality of input interfaces 211 in the second sequence.

In some embodiments of the present invention, the first sequence could be different from the line layout sequence of the plurality of output interfaces 222, the same as (or corresponding to) the line layout sequence of the plurality of output interfaces 222, or partially the same as (or partially corresponding to) the line layout sequence of the plurality of output interfaces 222.

As shown in FIG. 2a, in some embodiments of the present invention, the jumper line groups 232 are disposed in a two-wiring line combination. The two-wiring line combination includes a first wiring line 232a and a second wiring line 232b, wherein the second wiring line 232b is disposed in a turning line layout, and the first wiring line 232a is disposed in a jumper line layout. The first wiring line 232a electrically connects between an output interface g1 and an input interface G2, and the second wiring line 232b electrically connects between an output interface g2 and the input interface G1. If the sequence of the control signal passing through the output interface is from g1 to g2 (g1→g2), the sequence of the control signal arriving at the input interface is from G2 to G1 (G2→G1).

Figure 2B:
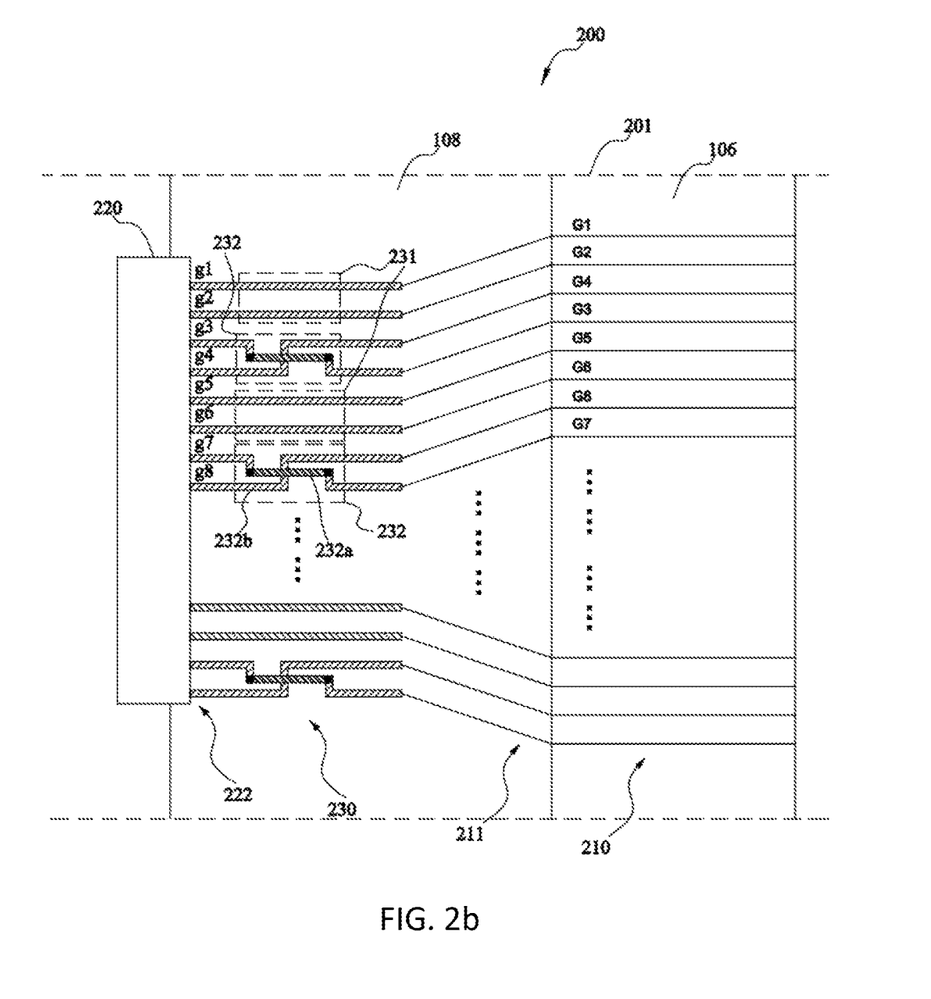
FIG. 2b shows a wiring structure of a display panel according to an embodiment of the present invention.

FIG. 2b shows a wiring structure of a display panel according to an embodiment method of the present invention. In some embodiments of the present invention, the wiring line group 231 is disposed in a two-wiring line combination, the jumper line group 232 is also disposed in a two-wiring line combination, wherein the plurality of wiring line groups 231 and the plurality of jumper line groups 232 are disposed differently and to be interlaced in each two adjacent line groups. The first sequence is the same as the line layout sequence of the plurality of output interfaces 222. That is, the sequence of the control signal outputting from the gate driving module 220 is from g1 to g8 (g1→g8), and the sequence of the control signal got by the plurality of input interface 211 is from G1, G2, G4, G3, G5, G6, G8 to G7 (G1→G2→G4→G3→G5→G6→G8→G7).

In some embodiments of the present invention, the plurality of wiring line groups 231 and the plurality of jumper line groups 232 are disposed by interlacing each other in a continuous way or a partially continuous way.

Figure 2C:
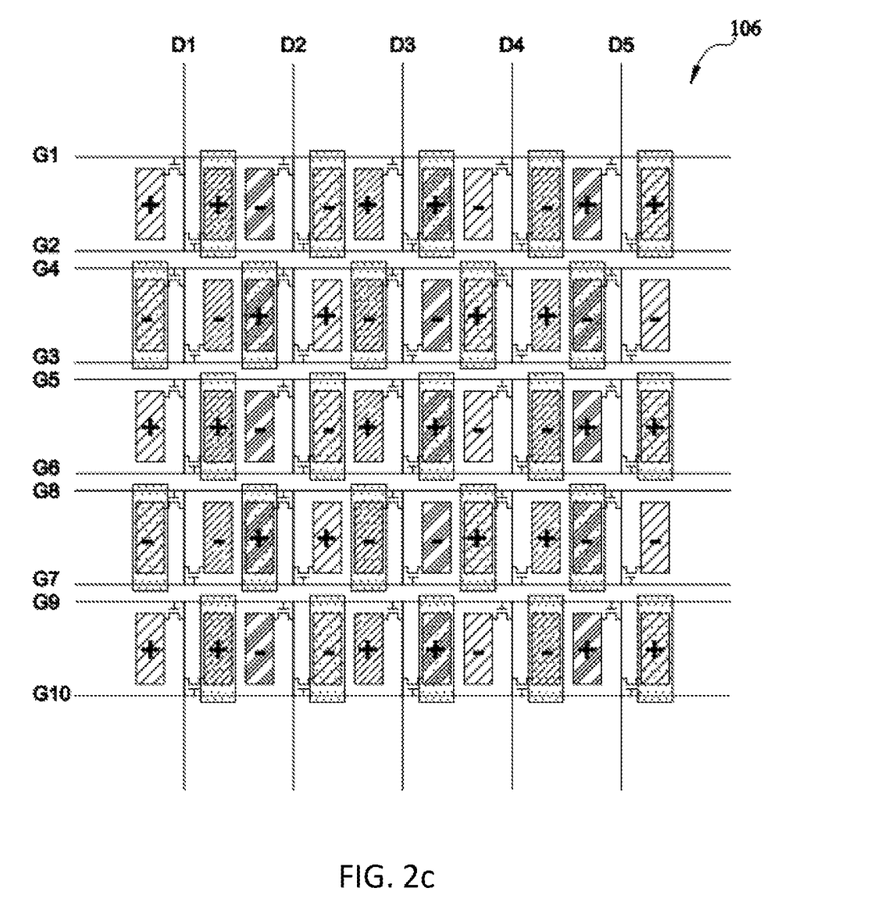
FIG. 2c shows polarities of a pixel unit of a half source driving (HSD) display panel according to an embodiment of the present invention.

FIG. 2c shows polarities of a pixel unit of a half source driving (HSD) display panel according to an embodiment method of the present invention. Each pixel unit includes a first subpixel and a second subpixel which have different colors, wherein the first subpixel and the second subpixel electrically are connected to different scan lines through the corresponding active switches, while the first subpixel and the second subpixel are electrically connected to a common data line. For example, a pixel unit on a scan line D1 comprises a first subpixel and a second subpixel, wherein the first subpixel and the second subpixel are electrically connected to a scan line G1 and a scan line G2 through the active switch respectively, while the first subpixel and the second subpixel are electrically connected to a common data line D1. The above-mentioned method can be applied to all of the pixel units. In the plurality of gate lines 210, in the G3 line and the G4 line, and in the G7 line and the G8 line, the sequence of getting the control signals are contrary to the sequence of getting the control signals in the G1 line and the G2 line, and in the G5 line and the G6 line. The following lines are operated in the same way. Therefore, in the G$2n$+1 line and the G$2n$+2 line, the sequence of getting the control signals is contrary to the sequence of getting the control signals in the G$2n$−1 line and the G$2n$ line. That is, the sequence of charging pixel units connected to the G$2n$+1 line and the G$2n$+2 line, is contrary to the sequence of charging pixel units connected to the G$2n$−1 line and the G$2n$ line. Therefore, although, when the line-and-two-dot-inversion driving method is applied to a half source driving (HSD) pixel array, since the polarities of two adjacent pixels (two dots) in a line are the same, there is still a large latency difference of a signal arriving at adjacent pixels. However, the present invention can adjust the sequence of charging pixel units in adjacent line, so that an undercharged pixel unit will be interlaced and separated. Therefore, the problem of adjacent vertical bright and dark lines in a display image is resolved and the display quality and display homogeneity of a display panel is improved.

Figure 2D:
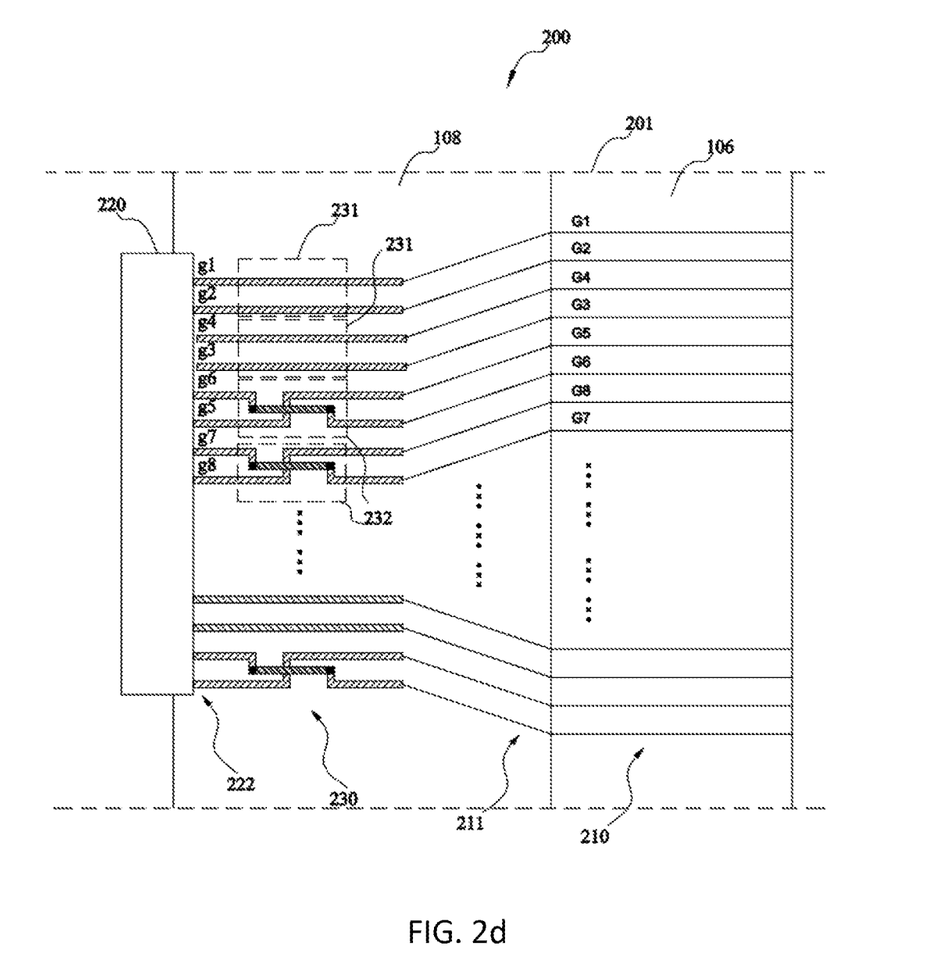
FIG. 2d shows a wiring structure of a display panel according to an embodiment of the present invention.

FIG. 2d shows a wiring structure of a display panel according to an embodiment method of the present invention. In some embodiments of the present invention, the first sequence is different from the line layout sequence of the plurality of output interfaces 222. For example, the sequence of the control signal outputting from the gate driving module 220 is from g1, g2, g4, g3, g6, g8 to g7 (g1→g2→g4→g3→g6→g5→g7→g8), and the sequence of the control signal got by the plurality of input interface 211 is from G1 to G7 (G1→G2→G4→G3→G5→G6→G8→G7). The wiring line group 231 and the jumper line group 232 are disposed is disposed in a two-wiring line combination, and they are disposed to be interlaced selectively, wherein the wiring line group 231 is disposed between the output interfaces (g3, g4) and the input interface (G3, G4), and the jumper line group 232 is disposed between the output interfaces (g5, g6) and the input interfaces (G5, G6), so that the sequence of the control signal got by the plurality of input interface 211 can be from G1, G2, G4, G3, G5, G6, G8 to G7

(G1→G2→G4→G3→G5→G6→G8→G7). Therefore, according to the sequence of the control signal outputting from the gate driving module 220 and the sequence of the control signal received by the plurality of gate lines, the sequence of charging pixel units connected to the G2$n$+1 line and the G2$n$+2 line, is contrary to the sequence of charging pixel units connected to the G2$n$−1 line and the G2$n$ line.

In some embodiments of the present invention, the jumper line group 232 includes a two-wiring line combination, a three-wiring line combination, a four-wiring line combination, or a combination thereof.

In some embodiments of the present invention, the gate driving module 220 includes a gate-chip on film 105 covering the peripheral of the substrate 201. The gate-chip on film 105 includes a plurality of output interface 221.

In one embodiment of the present invention, the plurality of connecting lines 230 are disposed in a fan-out area of the wiring area 108.

In one embodiment of the present invention, the present array substrate 200 comprises: a substrate 201, a gate driving module 220 and a plurality of connecting lines 230. The substrate 201 includes a display area 106 and its peripheral wiring area 108, wherein a plurality of active switches, a plurality of pixel units and a plurality of signal lines are disposed on the display area 106, the plurality of pixel units are electrically coupled to the plurality of active switches respectively, the plurality of active switches are electrically coupled to the plurality of signal lines respectively, and the plurality of signal lines include a plurality of gate lines 210 and a plurality of source lines. Each pixel unit is composed of a first subpixel and a second subpixel, wherein the first subpixel and the second subpixel are electrically coupled to different gate lines 210 respectively through corresponding active switches, and the first subpixel and the second subpixel are electrically coupled to a common source line. A plurality of input interfaces 211 of the plurality of gate lines 210 are disposed in the wiring area 108, wherein the plurality of input interfaces 211 include an input interface G1 and an input interface G2. The gate driving module 220 is disposed in the wiring area 108. The gate driving module 220 includes a plurality of output interfaces 222. A control signal is outputted from the gate driving module 220 according to the line layout sequence of the plurality of output interfaces 222. The plurality of output interfaces 222 include an output interface g1 and an output interface g2. The plurality of connecting lines 230 are disposed between the plurality of input interfaces 211 and the plurality of output interfaces 222, so that the plurality of input interfaces 211 are electrically coupled to the plurality of output interfaces 222 respectively. The plurality of connecting lines 230 include a plurality of wiring line groups 231 and a plurality of jumper line groups 232, and the plurality of wiring line groups 231 and the plurality of jumper line groups 232 are disposed to be interlaced. The jumper line group 232 includes a two-wiring line combination, wherein the two-wiring line combination includes a first wiring line 232$a$ and a second wiring line 232$b$. The first wiring line 232$a$ electrically couples between the output interface g1 and the input interface G2, and the second wiring line 232$b$ electrically couples between the output interface g2 and the input interface G1. The second wiring line 232$b$ can be disposed in a turning line, a straight line, a curve line, or a slanted line. The first wiring line 232$a$ is disposed in a jumper line. The sequence of input signals are contrary to the sequence of output signals for the two-wiring line combination. The sequence of the control signals outputted from the plurality of output interfaces 222 is different from the sequence of the control signals received by the plurality of input interfaces 211.

In one embodiment of the present invention, the present display panel comprises: an array substrate and a corresponding substrate disposed oppositely to each other, wherein the array substrate includes every array substrate 200 above-mentioned in the foregoing embodiments.

In some embodiments of the present invention, the array substrate further comprises every embodiment above-mentioned.

In some embodiments of the present invention, the present display panel can be, but not limited to, a liquid crystal display panel. The present display panel can also be an OLED display panel, a W-OLED display panel, a QLED display panel, a plasma display panel, a curved display panel, or other type display panel.

The present invention can apply to any conventional manufacturing process, and can fulfil prior manufacturing requirements and maintain prior product cost. The advantages of the present invention include that it can change a receiving sequence of the control signal in a display area only through wiring layout. The present can achieve the purpose of adjusting the polarity of the pixel unit by adjusting the receiving sequence of the signal, so that the problem of adjacent vertical bright and dark lines in an image is resolved. In addition, since the present invention can change the receiving sequence of the control signal in the display area only through wiring layout, the sequence of output signals of driving components (for example, a driving IC, a driving chip) do not need to be adjusted, so that the cost of components can be reduced. Furthermore, since the present invention can change the receiving sequence of the control signal in the display area only through wiring layout, it can be applied to many types of display panel, so that the applicability is relatively high.

"In some embodiments of the present invention" and "In a variety of embodiments of the present invention" are used repeatedly through the description. They usually mean different embodiments. However, they can also mean the same embodiments. "Comprising", "having" and "including" are synonyms, except it is noted to be different or has other meanings before and after its description.

The present invention has been described in considerable detail with reference to certain preferred embodiments thereof. It should be understood that the description is for illustrative purpose, not for limiting the scope of the present invention. Those skilled in this art can readily conceive simple or equivalent variations and modifications, which are still within the spirit of the present invention.

What is claimed is:

1. An array substrate, comprising:
a substrate including a display area and a peripheral wiring area of the display area, wherein a plurality of active switches, a plurality of pixel units and a plurality of signal lines are disposed in the display area, and the plurality of pixel units are electrically coupled to the plurality of active switches respectively, and the plurality of active switches are electrically coupled to the plurality of signal lines respectively, and the plurality of signal lines include a plurality of gate lines and a plurality of source lines, wherein each pixel unit includes a first subpixel and a second subpixel, the first subpixel and the second subpixel are electrically coupled to different gate lines respectively through corresponding active switches, the first subpixel and the second subpixel are electrically coupled to a common source line, and a plurality of input interface of the plurality of gate lines are disposed in the wiring area;
a gate driving module disposed in the wiring area, the gate driving module including a plurality of output interfaces; and
a plurality of connecting lines disposed between the plurality of input interfaces and the plurality of output interfaces, so that the plurality of input interfaces is electrically coupled to the plurality of output interfaces respectively;
wherein the plurality of connecting lines include a plurality of wiring line groups and a plurality of jumper line groups, the plurality of wiring line groups and the plurality of jumper line groups are disposed to be interlaced, and a sequence of signals outputted from the plurality of jumper line groups are different from a sequence of signals outputted from the plurality of wiring line groups;
wherein the plurality of connecting lines are disposed in a fan-out area of the wiring area.

2. The array substrate according to claim 1, wherein each of the jumper line groups includes a first wiring line and a second wiring line, wherein the second wiring line includes a turning line.

3. The array substrate according to claim 1, wherein each of the jumper line groups includes a first wiring line and a second wiring line, wherein the second wiring line includes a straight line.

4. The array substrate according to claim 1, wherein each of the jumper line groups includes a first wiring line and a second wiring line, wherein the second wiring line includes a curve line.

5. The array substrate according to claim 1, wherein each of the jumper line groups includes a first wiring line and a second wiring line, wherein the second wiring line includes a slanted line.

6. The array substrate according to claim 1, wherein the plurality of jumper line groups includes a two-wiring line combination, a three-wiring line combination, a four-wiring line combination, or a combination thereof.

7. The array substrate according to claim 1, wherein control signals are outputted from the gate driving module through the plurality of output interfaces in a first sequence, and the control signals are received by the plurality of input interfaces in a second sequence.

8. The array substrate according to claim 7, wherein the first sequence is different from the line layout sequence of the plurality of output interfaces.

9. The array substrate according to claim 7, the first sequence is the same as the line layout sequence of the plurality of output interfaces.

10. The array substrate according to claim 7, the first sequence is partially the same as the line layout sequence of the plurality of output interfaces.

11. The array substrate according to claim 1, wherein the gate driving module includes a gate-chip on film covering the peripheral of the substrate.

12. The array substrate according to claim 11, wherein the gate-chip on film includes a plurality of output interfaces.

13. The array substrate according to claim 1, wherein the plurality of wiring line groups and the plurality of jumper line groups are disposed differently and to be interlaced in each two adjacent line groups.

14. The array substrate according to claim 1, wherein the plurality of wiring line groups and the plurality of jumper line groups are disposed to be interlaced in a continuous way.

15. The array substrate according to claim 1, wherein the plurality of wiring line groups and the plurality of jumper line groups are disposed to be interlaced in a partially continuous way.

16. A display panel, comprising:
a corresponding substrate; and
an array substrate disposed oppositely to the corresponding substrate;
wherein the array substrate comprises:
a substrate including a display area and a peripheral wiring area of the display area, wherein a plurality of active switches, a plurality of pixel units and a plurality of signal lines are disposed in the display area, and the plurality of pixel units are electrically coupled to the plurality of active switches respectively, and the plurality of active switches are electrically coupled to the plurality of signal lines respectively, and the plurality of signal lines include a plurality of gate lines and a plurality of source lines, wherein each pixel unit includes a first subpixel and a second subpixel, the first subpixel and the second subpixel are electrically coupled to different gate lines respectively through corresponding active switches, the first subpixel and the second subpixel are electrically coupled to a common source line, a plurality of input interfaces of the plurality of gate lines are disposed in the wiring area;
a gate driving module disposed in the wiring area, the gate driving module including a plurality of output interfaces; and
a plurality of connecting lines disposed between the plurality of input interfaces and the plurality of output interfaces, so that the plurality of input interfaces are electrically coupled to the plurality of output interfaces respectively;
wherein the plurality of connecting lines include a plurality of wiring line groups and a plurality of jumper line groups, the plurality of wiring line groups and the plurality of jumper line groups are disposed to be interlaced, and a sequence of signals outputted from the plurality of jumper line groups are different from a sequence of signals outputted from the plurality of wiring line groups;
wherein the plurality of connecting lines are disposed in a fan-out area of the wiring area.

17. The display panel according to claim 16, wherein each of the jumper line groups includes a first wiring line and a second wiring line, wherein the second wiring line is a turning line.

18. The display panel according to claim 16, wherein each of the jumper line groups includes a first wiring line and a second wiring line, wherein the second wiring line is a straight line.

* * * * *